(12) United States Patent
Zhang et al.

(10) Patent No.: US 8,956,926 B2
(45) Date of Patent: Feb. 17, 2015

(54) METHOD FOR MANUFACTURING SELF-ALIGNED THIN FILM TRANSISTOR

(75) Inventors: Shengdong Zhang, Shenzhen (CN); Xin He, Shenzhen (CN); Yi Wang, Shenzhen (CN); Dedong Han, Shenzhen (CN); Ruqi Han, Shenzhen (CN); Jeng Han, legal representative, Shenzhen (CN)

(73) Assignee: Peking University Shenzhen Graduate School, Shenzhen, Guangdong (CN)

( * ) Notice: Subject to any disclaimer, the term of this patent is extended or adjusted under 35 U.S.C. 154(b) by 0 days.

(21) Appl. No.: 13/376,836

(22) PCT Filed: Jun. 13, 2011

(86) PCT No.: PCT/CN2011/075653
§ 371 (c)(1),
(2), (4) Date: Sep. 24, 2013

(87) PCT Pub. No.: WO2012/097564
PCT Pub. Date: Jul. 26, 2012

(65) Prior Publication Data
US 2014/0011329 A1    Jan. 9, 2014

(30) Foreign Application Priority Data

Jan. 18, 2011 (CN) .......................... 2011 1 0020672

(51) Int. Cl.
*H01L 21/00* (2006.01)
*H01L 29/66* (2006.01)
*H01L 29/49* (2006.01)
*H01L 29/786* (2006.01)

(52) U.S. Cl.
CPC ...... *H01L 29/66742* (2013.01); *H01L 29/4908* (2013.01); *H01L 29/78618* (2013.01); *H01L 29/7869* (2013.01); *H01L 29/78696* (2013.01)
USPC .......................................... 438/149; 438/158

(58) Field of Classification Search
USPC .................................................. 438/149, 158
See application file for complete search history.

(56) References Cited

U.S. PATENT DOCUMENTS

2002/0084465 A1* 7/2002 Green et al. .................... 257/91
2004/0183130 A1* 9/2004 Hara ............................. 257/331

FOREIGN PATENT DOCUMENTS

JP          08-279615       * 10/1996

* cited by examiner

*Primary Examiner* — Karen Kusumakar
(74) *Attorney, Agent, or Firm* — Perkins Coie LLP

(57) ABSTRACT

Disclosed is a method for manufacturing a self-aligned metal oxide thin film transistor. According to the present invention, a metal oxide semiconductor layer having a high carrier concentration is formed, and then a channel region which is self-aligned with a gate electrode is oxidized by a plasma having oxidbillity so that the channel region has a low carrier concentration and the source and drain regions have high carrier concentrations while the resulting transistor has a self-aligned structure. In addition, the threshold voltage of the transistor is controlled by the conditions under which the channel region of the transistor is subsequently oxidized by plasma having oxidbillity at a low temperature. Therefore, the controllability of the characteristics of the transistor is improved significantly, and the manufacturing process is simplified.

12 Claims, 11 Drawing Sheets

METHOD FOR MANUFACTURING SELF-ALIGNED THIN FILM TRANSISTOR

CROSS REFERENCE TO RELATED APPLICATIONS

This application is a 35 USC §371 National Stage application of, and claims priority of, International Application No. PCT/CN2011/075653 filed Jun. 13, 2011, which further claims the benefit and priority to China Patent Application No. 201110020672.5 filed Jan. 18, 2011. The disclosure of each of the prior applications is considered part of and is incorporated by reference in the disclosure of this application.

FIELD OF THE INVENTION

The present invention relates to a method for manufacturing a thin film transistor, especially to a method for manufacturing a self-aligned metal oxide semiconductor thin film transistor.

BACKGROUND OF THE INVENTION

Thin film transistors are used as switching elements or integrated elements of peripheral driving circuits in various display devices. Presently, the widely used thin film transistors mainly include amorphous silicon thin film transistors and polycrystalline silicon thin film transistors. However, since the amorphous silicon thin film transistors have low mobility and easy performance degradation, the applications in the pixel driving of an OLED and in the integration of peripheral driving circuits of a LCD and OLED are limited. Moreover, manufacturing the polycrystalline silicon thin film transistors needs a high temperature, the manufacturing cost is high, and the performance uniformity of the polycrystalline silicon thin film transistors is poor. Thus, the polycrystalline silicon thin film transistors are not suitable to the large-size panel displays. Therefore, for developments of the large-size panel displays, it is needed to develop more advance thin film transistors. Currently, the new developing thin film transistors mainly include metal oxide semiconductor thin film transistors represented by the zinc oxide semiconductor thin film transistors, microcrystalline thin film transistors and organic semiconductor thin film transistors.

The zinc oxide based and indium oxide based thin film transistors have low manufacturing process temperatures, low manufacturing cost, high carrier mobility, and uniform and stable performance. That is, the zinc oxide based and indium oxide based thin film transistors have the advantages both of the amorphous silicon thin film transistors and of the polycrystalline silicon thin film transistors, and are large-size microelectronic devices having a good prospect. However, there is a disadvantage in the method for manufacturing the zinc oxide based thin film transistors. Specifically, the resulting zinc oxide based thin film transistors have non-self-aligned structures, resulting in large parasitic elements existing in the transistors and uncontrollable characteristics discreteness. The parasitic capacitances do great damage to uncontrollable characteristics discreteness. The parasitic capacitances do great damage to performances of a pixel driving unit and a peripheral driving circuit. Existing means for eliminating the impact of the parasitic capacitance tends to increase complications of the transistor's structure and manufacturing process. There is another problem in the zinc oxide based thin film transistors. That is, the zinc oxide based thin film transistors have such disadvantages that the formed semiconductor channel layer tends to have a very high carrier concentration, so that the threshold voltage of the transistors is very low and even negative (for the n-typed transistors). That is to say, when the gate is in the state of zero bias, the transistor cannot be turned off sufficiently. If the channel layer is fabricated into a high-resistance layer having a low concentration, the parasitic resistance of source and drain regions will be increased accordingly. Therefore, there is needed to add a metal layer having low-resistance, resulting in a more complicated process.

SUMMARY OF THE INVENTION

The main technical problem to be solved by the present invention is to provide a method for manufacturing a self-aligned metal oxide thin film transistor. While source and drain regions in an active layer of the transistor have high carrier concentrations, and a channel region of the active layer has a low carrier concentration at a gate bias of zero, it is ensured that the resulting transistor has a self-aligned structure.

According to one aspect of the present invention, there is provided a method for manufacturing a self-aligned thin film transistor, comprising:

a step of forming a gate electrode, wherein the metal gate electrode is formed on a substrate;

a step of forming gate dielectric layer, wherein the gate dielectric layer covering the gate electrode is formed on the substrate;

a step of forming and processing an active region, wherein a metal oxide semiconductor layer having a high carrier concentration is formed on the gate dielectric layer and processed to form the active region including a source region, a drain region and a channel region, a layer of photoresist is then coated on the metal oxide semiconductor layer, exposed from a back surface of the substrate by using the gate electrode as a mask and developed so that a photoresist pattern is formed, the photoresist pattern is processed so that the channel region on the metal oxide semiconductor layer is exposed and oxidized by a plasma having oxidbillity at a temperature which is lower than the highest temperature that the substrate can stand; and a step of leading electrodes, wherein electrode leads for the source region, drain region and gate electrode are formed.

In an embodiment of the present invention, the step of forming and processing an active region further comprises performing a thermal treatment on the metal oxide semiconductor layer in an oxygen-free environment before the metal oxide semiconductor layer is processed to form the active region.

In an embodiment of the present invention, the channel region is oxidized by a plasma having oxidbillity at a temperature of 25-180° C.

In an embodiment of the present invention, the method further comprises: prior to coating a layer of photoresist on the metal oxide semiconductor layer forming the active region, forming a dielectric protection layer on the metal oxide semiconductor layer, coating a layer of photoresist on the dielectric protection layer and processing the dielectric protection layer with the photoresist so as to expose the channel region on the metal oxide semiconductor layer.

In an embodiment of the present invention, the layer of photoresist is a negative one, and the following processes are performed after the layer of photoresist is formed: the layer of photoresist is exposed from the back surface of the substrate by using the gate electrode as a mask and developed so that a photoresist pattern is formed, and thus the channel region on the metal oxide semiconductor layer is exposed.

In an embodiment of the present invention, the layer of photoresist is a negative one, and the following processes are performed after the layer of photoresist is formed: the layer of photoresist is exposed from the back surface of the substrate by using the gate electrode as a mask and developed so that a photoresist pattern is formed, and then the dielectric protection layer is removed by using the photoresist pattern as a mask so that the channel region on the metal oxide semiconductor layer is exposed.

In an embodiment of the present invention, the layer of photoresist is a positive one, and the following processes are performed after the layer of photoresist is formed: the layer of photoresist is exposed from the back surface of the substrate by using the gate electrode as a mask and developed so that a photoresist pattern is formed, then a dielectric protection layer is formed on the photoresist pattern, the dielectric protection layer is processed so that the channel region on the metal oxide semiconductor layer is exposed.

In an embodiment of the present invention, the layer of photoresist is a positive one, and the following processes are performed after the layer of photoresist is formed: the layer of photoresist is exposed from the back surface of the substrate by using the gate electrode as a mask and developed so that a photoresist pattern is formed, then a layer of metal film is formed on the photoresist pattern, the layer of metal film is processed so that the channel region on the metal oxide semiconductor layer is exposed.

In the present invention, the metal oxide semiconductor layer having a high carrier concentration is formed so that the source and drain regions of the thin film transistor have high carrier concentrations. Furthermore, a layer of photoresist is coated on the metal oxide semiconductor layer having the active region, then the layer of photoresist is exposed from the back surface of the substrate by using the gate electrode as a mask and developed so that a photoresist pattern is formed. The photoresist pattern is processed accordingly so that the channel region on the metal oxide semiconductor layer is exposed and self-aligned with the gate electrode. Next, the exposed channel region is oxidized by a plasma having oxidbillity at a temperature which is lower than the highest temperature that the substrate can stand. Thus, while source and drain regions have high carrier concentrations, and the channel region of the active layer has a low carrier concentration at a gate bias of zero. In addition, the threshold voltage of the transistor is controlled by the conditions under which the channel region of the transistor is subsequently oxidized by plasma having oxidbillity at a low temperature. Thus, the controllability of the characteristics of the transistor is improved significantly. According to the conventional manufacturing method, the voltage ratio of the oxygen to the argon in the sputtering atmosphere is adjusted so as to control the threshold voltage. Since the threshold voltage is very sensitive to the voltage ratio, the controllability is poor.

Moreover, since the photoresist is exposed from a back surface of the substrate when the active region is processed, the gate electrode functions as a natural mask plate. In this way, it is unnecessary to fabricate a mask plate, reducing the cost and simplifying the processing steps. On the other hand, since the gate electrode functions as a mask plate, the channel region can be preciously aligned with the gate electrode, reducing the possibility of generating parasitic elements and improving the uniformity of the performance and efficiencies of the transistor.

Further, the oxygen plasma has a very high activity, the channel region can be oxidized by the oxygen plasma even at room temperature. Thus, it is unnecessary that the channel region is oxidized after being heated to a certain temperature.

Therefore, the temperature at which the transistor is manufactured can be reduced significantly and it is possible that the substrate used at low temperatures (such as a plastic substrate) can be used in the manufacturing process of the transistor.

BRIEF DESCRIPTION OF THE DRAWINGS

FIGS. 2-8 show successively the main steps of manufacturing the thin film transistor according to an embodiment of the present invention, wherein:

FIG. 2 shows a step of forming a gate electrode;

FIG. 3 shows a step of forming a gate dielectric layer;

FIG. 4 shows a step of forming and thermally treating a metal oxide semiconductor layer;

FIG. 5 shows a step of treating the metal oxide semiconductor layer to form an active layer;

FIG. 6 shows a step of coating photoresist, patterning the photoresist and then oxidizing the channel region;

FIG. 7 shows a step of depositing a passivation layer and forming contact holes;

FIG. 8 shows a step of forming leads of the source, drain and gate electrodes;

FIGS. 9-17 show successively the main steps of manufacturing the thin film transistor according to another embodiment of the present invention, wherein:

FIG. 9 shows a step of forming a gate electrode;

FIG. 10 shows a step of forming a gate dielectric layer;

FIG. 11 shows a step of forming and thermally treating a metal oxide semiconductor layer;

FIG. 12 shows a step of depositing a dielectric protection layer and patterning the metal oxide semiconductor layer and dielectric protection layer;

FIG. 13 shows a step of patterning the dielectric protection layer so that the channel region is exposed;

FIG. 14 shows a step of oxidizing the channel region by oxygen plasma;

FIG. 15 shows a step of depositing a passivation layer and forming contact holes; and FIG. 16 shows a step of forming leads of the source, drain and gate electrodes;

FIGS. 17-25 show successively the main steps of manufacturing the thin film transistor according to another embodiment of the present invention, wherein:

FIG. 17 shows a step of forming a gate electrode;

FIG. 18 shows a step of forming a gate dielectric layer;

FIG. 19 shows a step of forming and thermally treating a metal oxide semiconductor layer;

FIG. 20 shows a step of processing the metal oxide semiconductor layer to form an active region;

FIG. 21 shows a step of forming a photoresist pattern by coating a positive photoresist on the front surface, exposing the photoresist from the back surface of the substrate and developing;

FIG. 22 shows a step of forming the dielectric protection layer;

FIG. 23 shows a step of oxidizing the channel region by oxygen plasma;

FIG. 24 shows a step of depositing a passivation layer and forming contact holes;

FIG. 25 shows a step of forming leads of the source and drain electrodes;

FIGS. 26-34 show successively the main steps of manufacturing the thin film transistor according to another embodiment of the present invention, wherein:

FIG. 26 shows a step of forming a gate electrode;

FIG. 27 shows a step of forming a gate dielectric layer;

FIG. 28 shows a step of forming and thermally treating a metal oxide semiconductor layer;

FIG. 29 shows a step of processing the metal oxide semiconductor layer to form an active region;

FIG. 30 shows a step of forming a photoresist pattern by coating a positive photoresist on the front surface, exposing the photoresist from the back surface of the substrate and developing;

FIG. 31 shows a step of forming a layer of metal film;

FIG. 32 shows a step of oxidizing the channel region by oxygen plasma;

FIG. 33 shows a step of depositing a passivation layer and forming contact holes; and FIG. 34 shows a step of forming leads of the source and drain electrodes.

DESCRIPTION OF THE PREFERRED EMBODIMENTS

In the embodiments of the present invention, an active layer of a thin film transistor is formed from a metal oxide semiconductor layer having a high carrier concentration. After the active layer is formed, source and drain regions are protected, and a channel region, which is self-aligned with a gate electrode, is exposed at a temperature lower than the highest temperature the substrate can stand to a plasma atmosphere having oxidbillity, such as oxygen plasma atmosphere or the like. Thus, an oxygen vacancy concentration in the channel region is reduced significantly and the channel region becomes a high-resistance layer having a low carrier concentration.

Hereinafter, the present invention will be described in detail by means of the embodiments thereof and with reference to the drawings.

Figure 1:
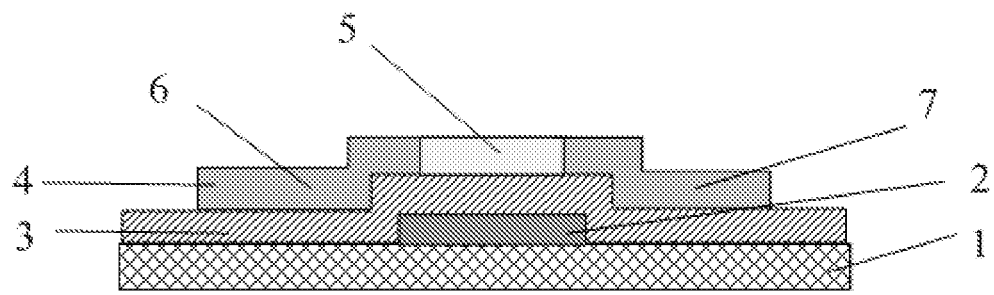
FIG. 1 is a schematic cross-sectional view of a thin film transistor according to an embodiment of the present invention.

With reference to FIG. 1, a sectional view for a thin film transistor in an embodiment is shown.

The thin film transistor comprises a gate electrode 2, a gate dielectric layer 3 and a metal oxide semiconductor layer 4. The metal oxide semiconductor layer 4 is composed of a channel region 5, a source region 6 and a drain region 7. The gate electrode 2 is formed on a substrate 1, and the gate dielectric layer 3 is formed on the substrate 1 and gate electrode 2 and covers the gate electrode 2. The metal oxide semiconductor layer 4 is formed over the gate dielectric layer 3. The channel region 5 forms a central portion of the metal oxide semiconductor layer 4 and is arranged on the gate dielectric layer 3 covering the gate electrode 2 and aligned with the gate electrode 2. The source region 6 and drain region 7 form two end portions of the metal oxide semiconductor layer 4. The source region 6 and drain region 7 are arranged on the gate dielectric layer 3 and connected with the channel region 5, respectively.

In an example, the gate electrode 2 may be formed from metal material, such as chromium, molybdenum, titanium, aluminium or the like, and may be formed by, for example, magnetron sputtering or thermal evaporation. Generally, the gate electrode 2 has a thickness in the range of 100 to 300 nm and is opaque. The gate dielectric layer 3 is formed from insulating dielectric, such as silicon nitride, silicon oxide or the like, and may be formed by plasma enhanced chemical vapor deposition (PECVD) or magnetron sputtering. In another example, the gate dielectric layer 3 may be formed from metal oxide, such as aluminum oxide, tantalum oxide, hafnium oxide or the like, and may be formed by, for example, magnetron sputtering. Generally, the gate dielectric layer 3 has a thickness in the range of 100 to 400 nm. The metal oxide semiconductor layer 4 is formed from amorphous or polycrystalline metal oxide semiconductor material, such as zinc oxide based or indium oxide based film, and may be formed by, for example, magnetron sputtering. The metal oxide semiconductor layer 4 has a thickness in the range of 50 to 200 nm. Since the channel region 5 forms a central portion of the active layer 4, in the case where the channel region 5 is not biased, that is, the voltage of the gate electrode is zero, the channel region 5 has a very low carrier concentration and thus is in a high impedance state. The source region 6 and the drain region 7 are arranged at ends of the active layer 4, having a high carrier concentration and being in a low impedance state.

In an example, the gate dielectric layer is formed from a transparent material, and the substrate is formed from a transparent material which is high temperature resistance or not high temperature resistance.

Embodiment 1

A method for manufacturing the thin film transistor according to the present embodiment is shown in FIGS. 2-8 and comprises the following steps.

Figure 2:
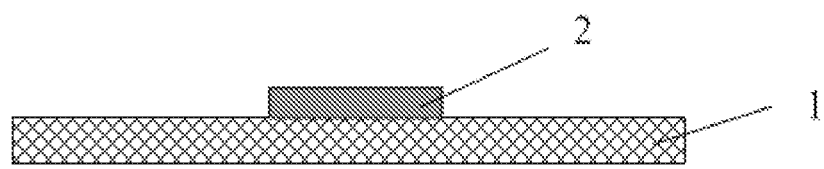

11) As shown in FIG. 2, a metal film having a thickness of 100-300 nm is formed on a surface (such as a front surface) of the substrate 1. The metal film may be formed by magnetron sputtering and may be formed from chromium, molybdenum, titanium, aluminium or the like. Then, the metal film is processed accordingly so that the gate electrode 2 is formed. For example, the gate electrode 2 may be formed by performing lithographic and etching processes on the metal film. In the present example, the substrate 1 may be resistant to high temperature, such as a glass substrate, or may be not resistant to high temperature, such as a plastic substrate. For ease of description, the surface of the substrate on which the thin film transistor is manufactured is called a front surface.

Figure 3:
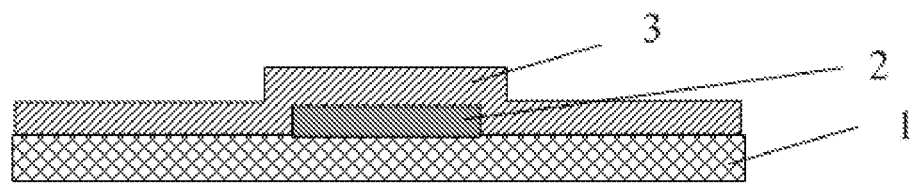

12) As shown in FIG. 3, an insulating film having a thickness of 100-400 nm is formed on the front surface of the substrate 1. The insulating film may be formed from insulating dielectric, such as silicon nitride, silicon oxide or the like, and may be formed by plasma enhanced chemical vapor deposition (PECVD). The insulating film covers the gate electrode 2 as the gate dielectric layer 3.

Figure 4:
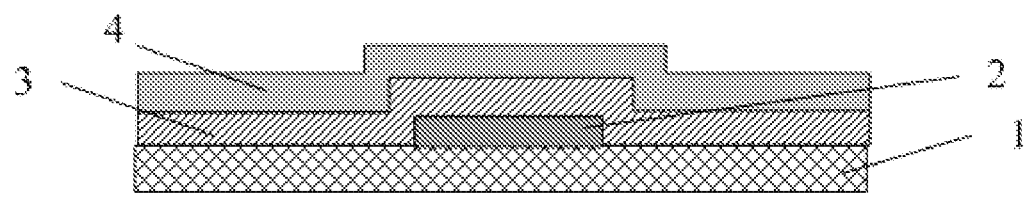

13) As shown in FIG. 4, the metal oxide semiconductor layer 4 is formed over the gate dielectric layer 3 and has a thickness of 50 to 200 nm. The metal oxide semiconductor layer 4 is formed from amorphous or polycrystalline metal oxide semiconductor material, such as zinc oxide based or indium oxide based film, and may be deposited by, for example, magnetron sputtering. In the case of the indium gallium zinc oxide (IGZO), the target is composed of the mixture of gallium oxide, indium oxide and zinc oxide. The mole ratio of gallium oxide to indium oxide to zinc oxide is X:Y:Z, wherein X>40%, Y>40, and Z<20%, and preferably equal to 3:3:1. In the case of indium oxide, used is a ceramic target of indium oxide, the purity of which is equal to or higher than 99.99%. Sputtering pressure is in the range of 0.5~2.5 Pa, and pure Argon is used as the sputtering gas. At this time, since a number of oxygen vacancies are generated in the entirely formed metal oxide semiconductor layer 4, the metal oxide semiconductor layer 4 functions as a low-resistance material having a high carrier concentration. If a lower resistance material is needed, a thermal process may be performed on the metal oxide semiconductor layer 4 in an oxygen-free environment. For example, the thermal process may be conducted in hydrogen, nitrogen or vacuum and under a temperature lower than the highest temperature that the substrate 1 can stand.

Figure 5:
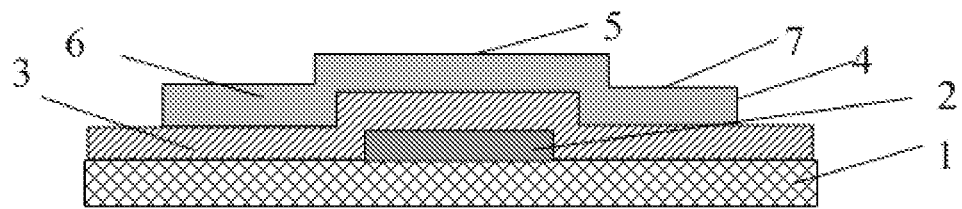

14) As shown in FIG. 5, the metal oxide semiconductor layer 4 is processed accordingly so that an active region is formed. The active region comprises the source region 6, the drain region 7 and the channel region 5. The metal oxide semiconductor layer 4 is processed by, for example, photolithography and etching.

Figure 6:
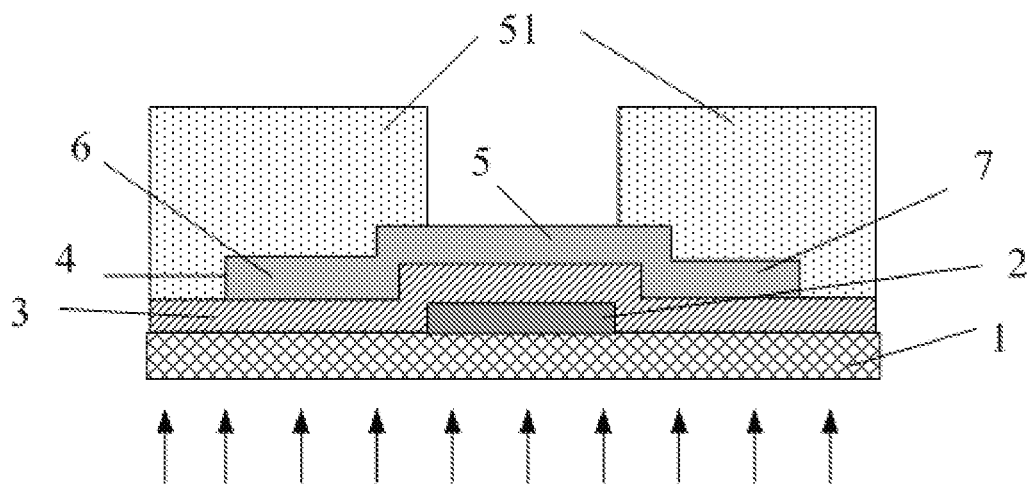

15) As shown in FIG. 6, the processed metal oxide semiconductor layer 4 is coated by a layer of photoresist which is negative. After the layer of negative photoresist is coated, the photoresist is exposed from the back surface of the substrate without any elements by using the gate electrode 2 as a mask. Then, a developing process is performed. The portion of the layer of photoresist which is not blocked by the gate electrode 2 is exposed and cannot be dissolved in a developing solution, while the portion of the layer of photoresist which is blocked by the gate electrode 2 is not exposed and thus dissolved in the developing solution. Thus, a photoresist pattern 51 is formed, and the channel region 5 in the central portion of the metal oxide semiconductor layer 4 is exposed and self-aligned with the gate electrode. Next, the channel region is oxidized by the oxygen plasma for 5~60 minutes at a low temperature. Since the channel region 5 is exposed and thus oxidized by the oxygen plasma, the concentration of oxygen vacancies in the channel region 5 is reduced and the channel region 5 turns to have a low carrier concentration. In the present embodiment, since the oxygen plasma is used, the oxidization may be conducted at low temperatures, such as 25-180° C. The upper temperature limit within which the oxidization is conducted cannot be higher than the highest temperature that the photoresist and the substrate 1 can stand.

Figure 7:
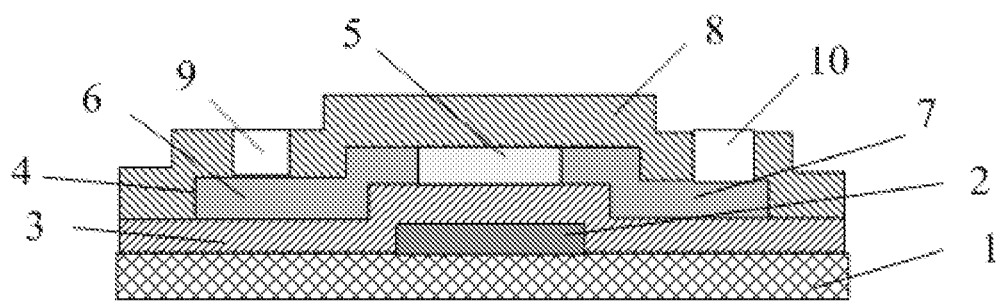

16) As shown in FIG. 7, a layer of silicon nitride 8 is deposited by plasma enhanced chemical vapor deposition (PECVD) or magnetron sputtering, and photolithography and etching processes are performed to form contact holes 9 and 10 of the electrode.

Figure 8:
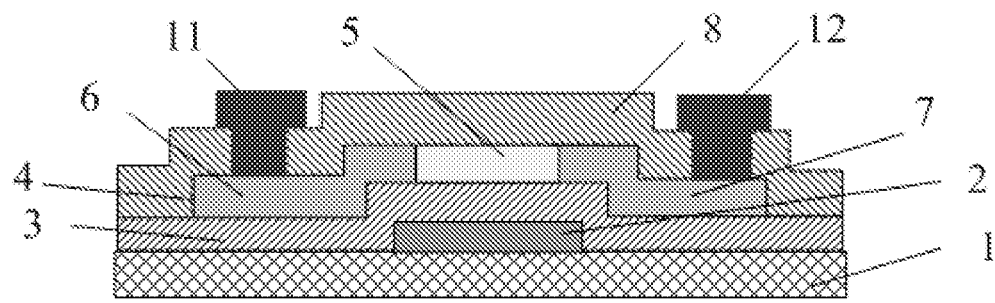

17) As shown in FIG. 8, a layer of aluminum film having a thickness of 100~300 nm is deposited by magnetron sputtering, and then subjected to photolithography and etching to form metal lead electrodes and interconnections 11 and 12 of the electrodes of the thin film transistor.

In the present embodiment, the channel region 5 is oxidized by the oxygen plasma at a low temperature. The activity of the free radicals in the plasma is much higher than that of the corresponding gas. For example, the activity of the oxygen free radicals in the oxygen plasma is much higher than that of the oxygen molecules. Thus, where the channel region 5 is oxidized by the oxygen plasma, the channel region 5 can be substantially oxidized even at a low temperature and the concentration of oxygen vacancies is reduced. Therefore, the substrate 1 can be formed not only from materials which are resistant to high temperatures, but also from materials for low temperatures.

It is inevitable for the conventional non-self-aligned technologies that large parasitic capacitances and characteristics nonuniformity exist in the transistors. As is well known, the parasitic capacitances do great damage to performances of a pixel driving unit and a peripheral driving circuit. Current means for eliminating the impact of the parasitic capacitances tends to increase complications of the transistor's structure and manufacturing process. In the present embodiment, in the step 15), the coated layer of photoresist is a negative one. After being coated, the layer of photoresist is exposed from the back surface of the substrate without any elements by using the gate electrode 2 as a mask. Then, a developing process is performed. The portion of the layer of photoresist which is not blocked by the gate electrode 2 is exposed and cannot be dissolved in a developing solution, while the portion of the layer of photoresist which is blocked by the gate electrode 2 is not exposed and thus dissolved in the developing solution. Thus, a photoresist pattern 51 is formed, and the channel region 5 in the central portion of the metal oxide semiconductor layer 4 is exposed. Next, the channel region is oxidized. Thus, the resulting transistor has a self-aligned structure and the manufacturing process of the self-aligned transistor is simpler than that of the existing non-aligned transistor.

A non-aligned transistor can be manufactured according to the method in the present embodiment. For example, a positive photoresist is coated in the step 15), and then subjected to photolithography and etching so that the channel region is exposed and then oxidized. The resulting transistor does not have a self-aligned structure.

Embodiment 2

Since the channel region 5 is oxidized by the oxygen plasma at a low temperature in the present invention, it is unnecessary to form a dielectric protection layer, simplifying the manufacturing process of transistors. However, the oxygen plasma has some effect on the protective photoresist layer. Although the advantage of using the photoresist layer as a protection layer lies in that the manufacturing process is simple, a portion of the photoresist may be destroyed by the oxygen plasma during the process, and thus the source and drain regions cannot be entirely protected from oxidation. Accordingly, for precisely protecting the source and drain regions, a dielectric protection layer may be formed and the formed dielectric protection layer can be subjected to high temperatures for the subsequent manufacturing process. The manufacturing steps are as follows.

Figure 9:
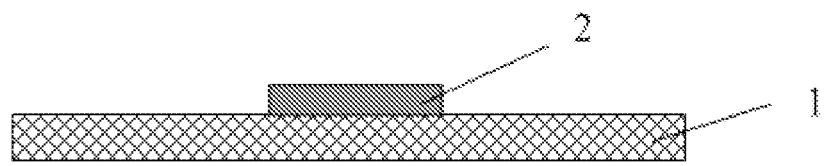

21) As shown in FIG. 9, a metal film having a thickness of 100-300 nm is formed on the front surface of the substrate 1. The metal film may be formed from chromium, molybdenum, titanium, aluminium or the like, and may be formed by magnetron sputtering. Then, the metal film is subjected to photolithography and etching so as to form the gate electrode 2. In the present embodiment, the substrate 1 may be resistant to high temperatures, or may be used at low temperatures.

Figure 10:
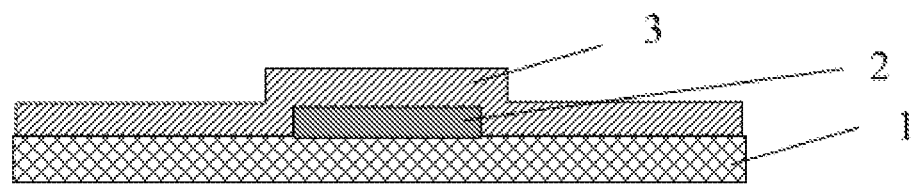

22) As shown in FIG. 10, an insulating film having a thickness of 100-400 nm is formed on the front surface of the substrate 1 by plasma enhanced chemical vapor deposition (PECVD). The insulating film may be formed from insulating dielectric, such as silicon nitride, silicon oxide or the like, covering the gate electrode 2 as the gate dielectric layer 3.

Figure 11:
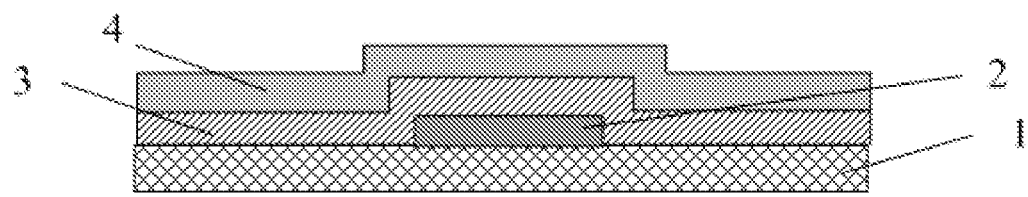

23) As shown in FIG. 11, a metal oxide semiconductor layer 4 is deposited over the gate dielectric layer 3 by radio magnetron sputtering and has a thickness of 50 to 200 nm. The metal oxide semiconductor layer 4 is formed from amorphous or polycrystalline metal oxide semiconductor material, such as zinc oxide based or indium oxide based film. In the case of the IGZO, the target is composed of the mixture of gallium oxide, indium oxide and zinc oxide. The mole ratio of gallium oxide to indium oxide to zinc oxide is X:Y:Z, wherein X>40%, Y>40, and Z<20%, and preferably equal to 3:3:1. In the case of indium oxide, used is a ceramic target of indium oxide, the purity of which is equal to or higher than 99.99%. Sputtering pressure is in the range of 0.5~2.5 Pa, and pure Argon is used as the sputtering gas. At this time, since a number of oxygen vacancies are generated in the entirely formed metal oxide semiconductor layer 4, the metal oxide semiconductor layer 4 functions as a low-resistance material having a high carrier concentration. If a lower resistance material is needed, a thermal process may be performed on the metal oxide semiconductor layer 4 in an oxygen-free environment. For example, the thermal process may be conducted in hydrogen, nitrogen or vacuum and under a temperature lower than the highest temperature that the substrate 1 can stand.

Figure 12:
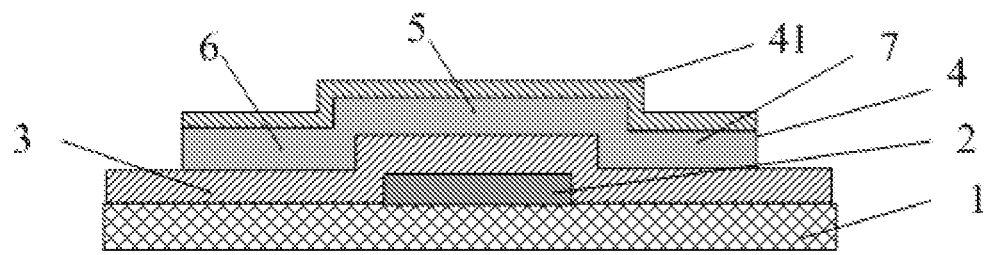

24) As shown in FIG. 12, a dielectric protection film is formed over the metal oxide semiconductor layer 4 processed by the step 23. The dielectric protection film may be formed from silicon oxide or silicon nitride by plasma enhanced chemical vapor deposition (PECVD) or magnetron sputtering, and has a thickness of 20-80 nm. The dielectric protection film and the metal oxide semiconductor layer 4 are subjected to photolithography and etching so that the active region protection layer 41 and an active region of the transistor are formed. The active region comprises the source region 6, the drain region 7 and the channel region 5.

Figure 13:
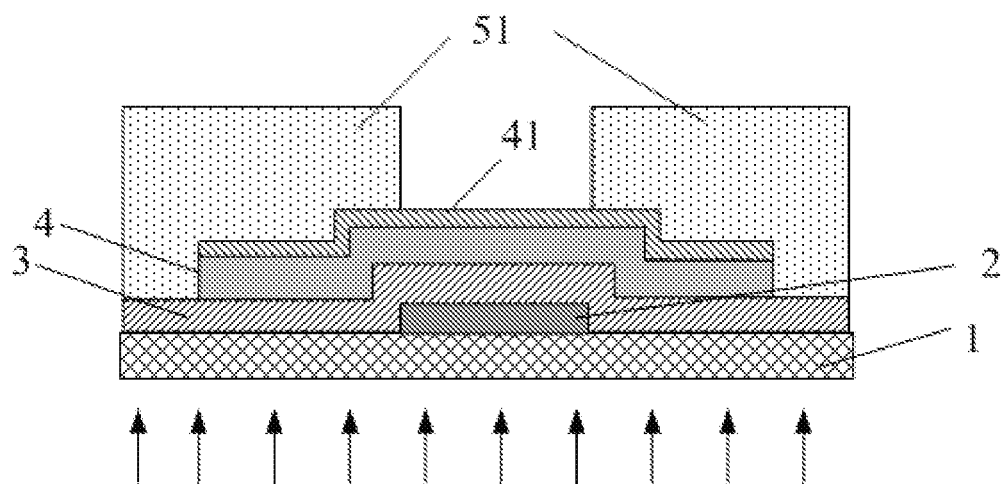
Figure 14:
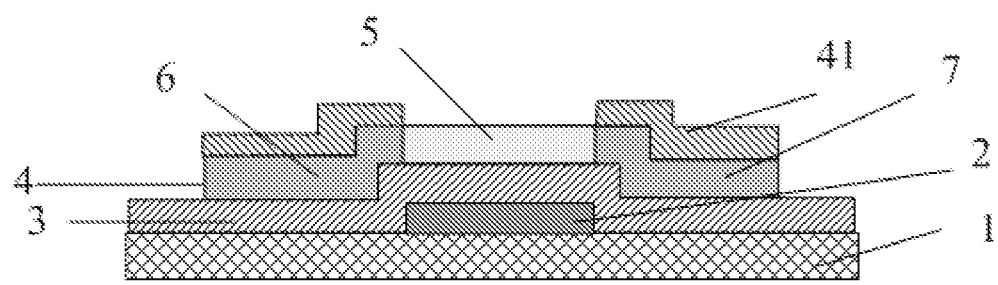

25) As shown in FIGS. 13 and 14, the active region protection layer 41 after being subjected to photolithography and etching is coated by a layer of photoresist which is negative. Then, the photoresist is exposed from the back surface of the substrate by using the gate electrode 2 as a mask in a direction indicated by an arrow in FIG. 14. Next, a developing process is performed. The portion of the layer of photoresist which is not blocked by the gate electrode 2 is exposed and cannot be dissolved in a developing solution, while the portion of the layer of photoresist which is blocked by the gate electrode 2 is not exposed and thus dissolved in the developing solution. Thus, a photoresist pattern 51 is formed. Based on the formed photoresist pattern 51, a dielectric protection film is etched, so that the channel region 5 in the central portion of the metal oxide semiconductor layer 4 is exposed, and the rest of the active region is still protected by the dielectric protection film. Next, the channel region is oxidized by a plasma having oxidbillity at a low temperature. In the present embodiment, the channel region can be oxidized by an oxygen plasma for 5~60 minutes. Since the channel region 5 is exposed and thus oxidized by the oxygen plasma, the concentration of oxygen vacancies in the channel region 5 is reduced and the channel region 5 turns to have a low carrier concentration. In the present embodiment, since the oxygen plasma is used, the oxidization may be conducted at low temperatures, such as 25-180° C. It should be noted that, prior to the oxidation, if the photoresist on the dielectric layer of the source and drains regions is retained, the highest temperature at which the oxidization can be conducted should be lower than that the substrate 1 and the photoresist can stand; and if the photoresist has been removed, the highest temperature at which the oxidization is conducted should be lower than the highest temperature the substrate 1 can stand.

Figure 15:
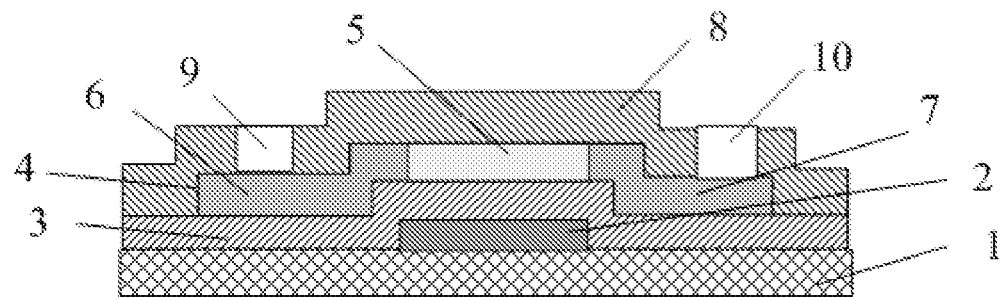

26) As shown in FIG. 15, a layer of silicon nitride 8 having a thickness of 100~300 nm is deposited by plasma enhanced chemical vapor deposition (PECVD) or magnetron sputtering. Then, the photolithography and etching processes are performed to form contact holes 9 and 10 of the electrode.

Figure 16:
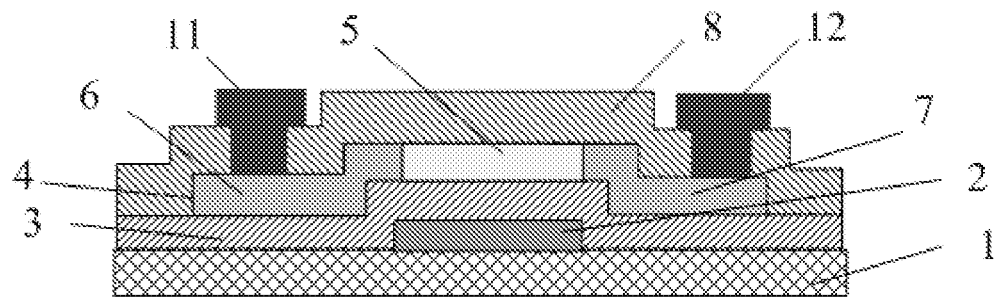

27) As shown in FIG. 16, a layer of aluminum film having a thickness of 100~300 nm is deposited by magnetron sputtering, and then subjected to photolithography and etching to form metal lead electrodes and interconnections 11 and 12 of the electrodes of the thin film transistor.

In the present embodiment, when the photoresist used in the step 25) is positive, and the photoresist is exposed and developed from the front surface of the substrate 1, the resulting transistor does not have a self-aligned structure.

Embodiment 3

In order to manufacture a transistor having a self-aligned structure, in the step 25) of the embodiment 2, a layer of positive photoresist may be coated and subjected to exposure, developing, etc. The detailed processes are as follows.

Figure 17:
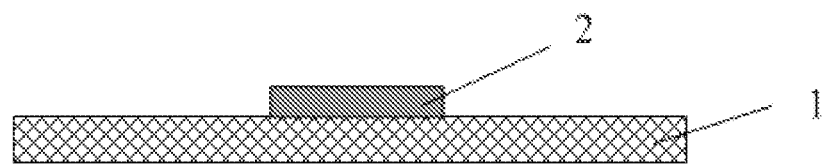

31) As shown in FIG. 17, a metal film having a thickness of 100-300 nm is formed on the front surface of the substrate 1. The metal film may be formed by magnetron sputtering and may be formed from chromium, molybdenum, titanium, aluminium or the like. Then, the metal film is processed accordingly, for example, subjected to photolithography and etching, so that the gate electrode 2 is formed. In the present embodiment, the substrate 1 may be resistant to a high temperature, such as a glass substrate, or may be not resistant to a high temperature, such as a plastic substrate.

Figure 18:
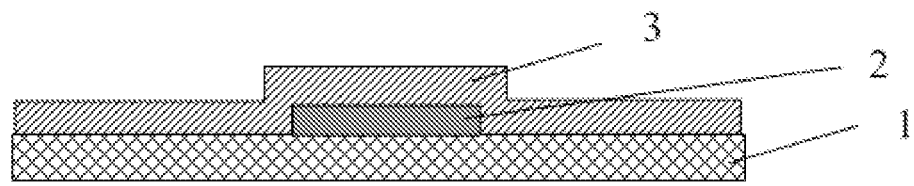

32) As shown in FIG. 18, an insulting film having a thickness of 100-400 nm is formed on the front surface of the substrate 1. The insulting film may be formed from insulating dielectric, such as silicon nitride, silicon oxide or the like, and may be formed by plasma enhanced chemical vapor deposition (PECVD), covering the gate electrode 2 as the gate dielectric layer 3.

Figure 19:
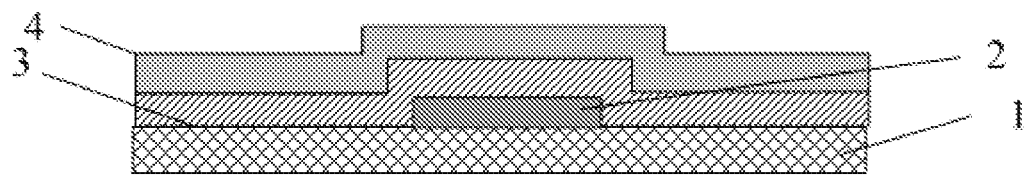

33) As shown in FIG. 19, the metal oxide semiconductor layer 4 is formed over the gate dielectric layer 3 and has a thickness of 50 to 200 nm. The metal oxide semiconductor layer 4 is formed from amorphous or polycrystalline metal oxide semiconductor material, such as zinc oxide based or indium oxide based film, and may be deposited by, for example, magnetron sputtering. In the case of the IGZO, the target is composed of the mixture of gallium oxide, indium oxide and zinc oxide. The mole ratio of gallium oxide to indium oxide to zinc oxide is X:Y:Z, wherein X>40%, Y>40, and Z<20%, and preferably equal to 3:3:1. In the case of indium oxide, used is a ceramic target of indium oxide, the purity of which is equal to or higher than 99.99%. Sputtering pressure is in the range of 0.5~2.5 Pa, and pure Argon is used as the sputtering gas. At this time, since a number of oxygen vacancies are generated in the entirely formed metal oxide semiconductor layer 4, the metal oxide semiconductor layer 4 functions as a low-resistance material having a high carrier concentration. If a lower resistance material is needed, a thermal process may be performed on the metal oxide semiconductor layer 4 in an oxygen-free environment. For example, the thermal process may be conducted in hydrogen, nitrogen or vacuum and under a temperature lower than the highest temperature that the substrate 1 can stand.

Figure 20:
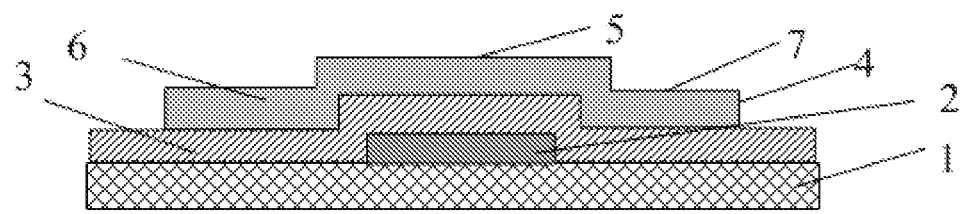

34) As shown in FIG. 20, the metal oxide semiconductor layer 4 is subjected to photolithography and etching so that an active region is formed. The active region comprises the source region 6, the drain region 7 and the channel region 5.

Figure 21:
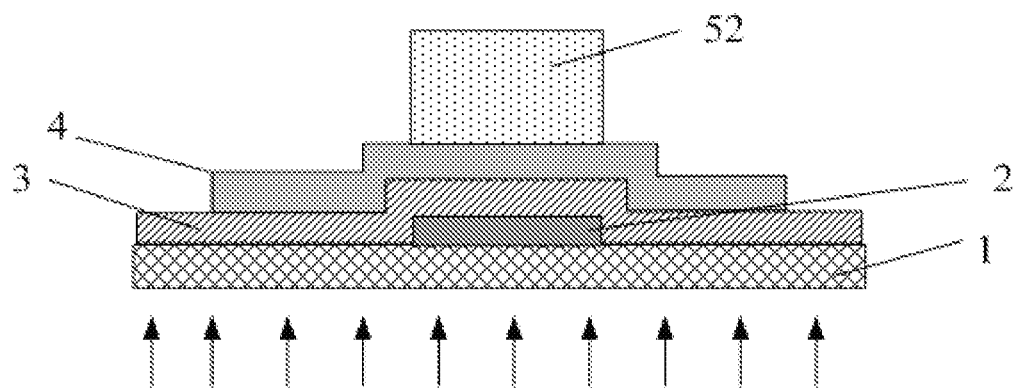

35) As shown in FIG. 21, the active region protection layer 41 after being subjected to photolithography and etching is coated by a layer of photoresist which is positive. Then, the photoresist is exposed from the back surface of the substrate by using the gate electrode 2 as a mask (in a direction indicated by an arrow in FIG. 21). Next, a developing process is performed. The portion of the layer of photoresist which is blocked by the gate electrode 2 is not exposed and thus cannot be dissolved in a developing solution, while the portion of the layer of photoresist which is not blocked by the gate electrode 2 is exposed and thus dissolved in the developing solution. Thus, a photoresist pattern as shown is formed.

Figure 22:
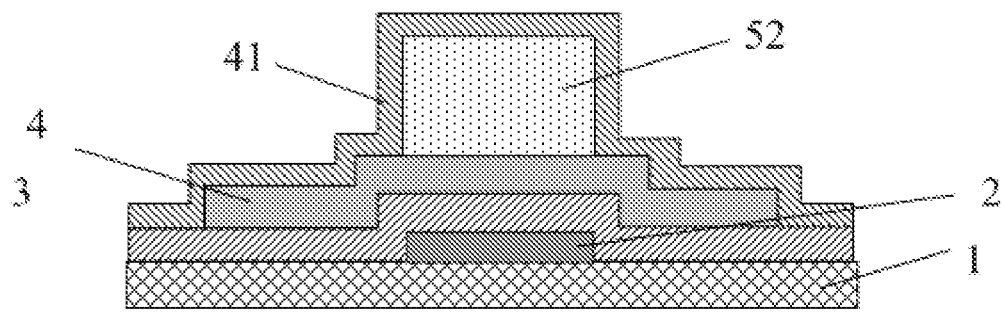

36) As shown in FIG. 22, a dielectric protection layer 41 is formed on the layer of photoresist 52 and the metal oxide semiconductor layer 4. The dielectric protection layer 41 may be formed from silicon oxide or silicon nitride by magnetron sputtering, and has a thickness of 20-80 nm.

Figure 23:
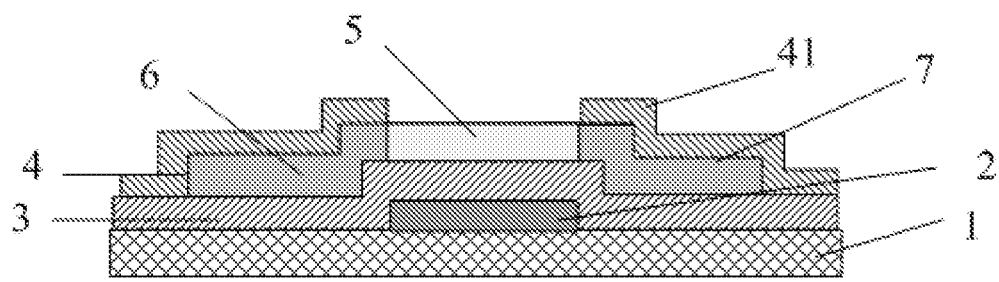

37) As shown in FIG. 23, the layer of photoresist 52 and the dielectric protection layer 41 on the surface of the layer of photoresist 52 have been removed by a lift-off process, so that the channel region 5 in the central portion of the metal oxide semiconductor layer 4 is exposed, and the rest is still protected by the dielectric protection layer. Thus, a pattern of the dielectric protection layer is obtained. Next, the channel region is oxidized by a plasma having oxidbillity at a low temperature. In the present example, the channel region can be oxidized by an oxygen plasma for 5~60 minutes. Since the channel region 5 is exposed and thus oxidized by the oxygen plasma, the concentration of oxygen vacancies in the channel region 5 is reduced and the channel region 5 turns to have a low carrier concentration. In the present example, since the oxygen plasma is used, the oxidization may be conducted at low temperatures, such as 25-180° C. The upper temperature limit within which the oxidization can be conducted is the highest temperature that the substrate 1 can stand.

Figure 24:
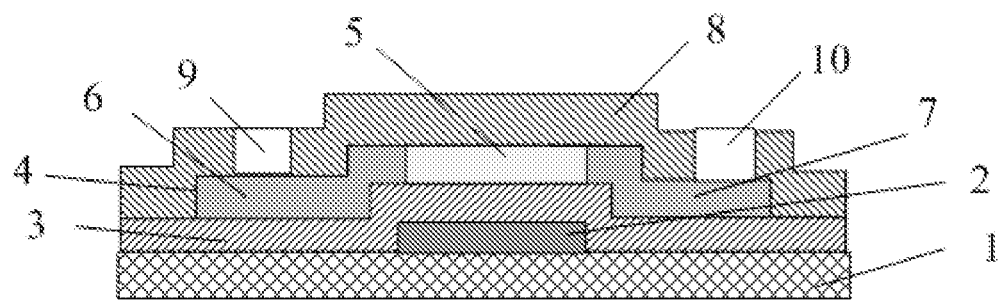

38) As shown in FIG. 24, a layer of silicon nitride 8 having a thickness of 100~300 nm is deposited by plasma enhanced chemical vapor deposition (PECVD) or magnetron sputtering. Then, the photolithography and etching processes are performed to form contact holes 9 and 10 of the electrode.

Figure 25:
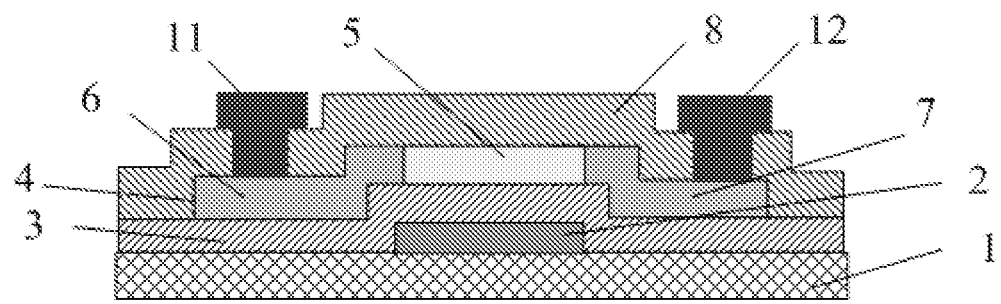

39) As shown in FIG. 25, a layer of aluminum film having a thickness of 100~300 nm is deposited by magnetron sputtering, and then subjected to photolithography and etching to form metal lead electrodes and interconnections 11 and 12 of the electrodes of the thin film transistor.

Embodiment 4

In order to manufacture a transistor having a self-aligned structure, a layer of aluminum film may be formed in the step 36) of the example 3 so that the source region forms a better ohm contact with the drain region. Then, processes are performed accordingly as follows.

Figure 26:
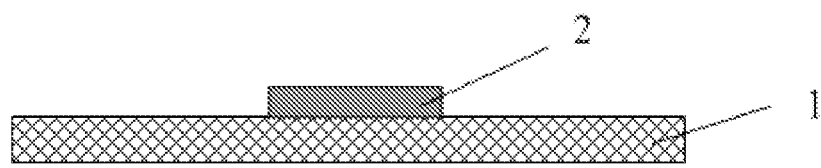

41) As shown in FIG. 26, a metal film having a thickness of 100-300 nm is formed on the front surface of the substrate 1. The metal film may be formed by magnetron sputtering and may be formed from chromium, molybdenum, titanium, aluminium or the like. Then, the metal film is processed accordingly, for example, subjected to photolithography and etching, so that the gate electrode 2 is formed. In the present embodiment, the substrate 1 may be resistant to a high temperature, such as a glass substrate, or may be not resistant to a high temperature, such as a plastic substrate.

Figure 27:
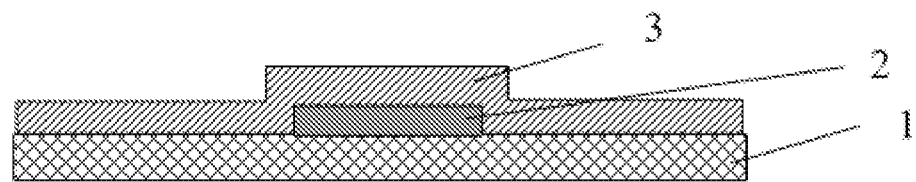

42) As shown in FIG. 27, an insulting film having a thickness of 100-400 nm is formed on the front surface of the substrate 1. The insulting film may be formed from insulating dielectric, such as silicon nitride, silicon oxide or the like, and may be formed by plasma enhanced chemical vapor deposition (PECVD), covering the gate electrode 2 as the gate dielectric layer 3.

Figure 28:
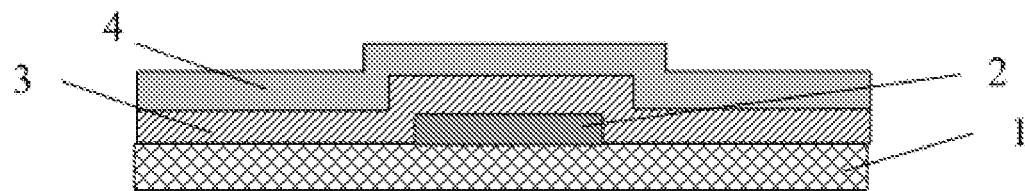

43) As shown in FIG. 28, the metal oxide semiconductor layer 4 is formed over the gate dielectric layer 3 and has a thickness of 50 to 200 nm. The metal oxide semiconductor layer 4 is formed from amorphous or polycrystalline metal oxide semiconductor material, such as zinc oxide based or indium oxide based film, and may be deposited by, for example, magnetron sputtering. In the case of the IGZO, the target is composed of the mixture of gallium oxide, indium oxide and zinc oxide. The mole ratio of gallium oxide to indium oxide to zinc oxide is X:Y:Z, wherein X>40%, Y>40, and Z<20%, and preferably equal to 3:3:1. In the case of indium oxide, used is a ceramic target of indium oxide, the purity of which is equal to or higher than 99.99%. Sputtering pressure is in the range of 0.5~2.5 Pa, and pure argon is used as the sputtering gas. At this time, since a number of oxygen vacancies are generated in the entirely formed metal oxide semiconductor layer 4, the metal oxide semiconductor layer 4 functions as a low-resistance material having a high carrier concentration. If a lower resistance material is needed, a thermal process may be performed on the metal oxide semiconductor layer 4 in an oxygen-free environment. For example, the thermal process may be conducted in hydrogen, nitrogen or vacuum and under a temperature lower than the highest temperature that the substrate 1 can stand.

Figure 29:
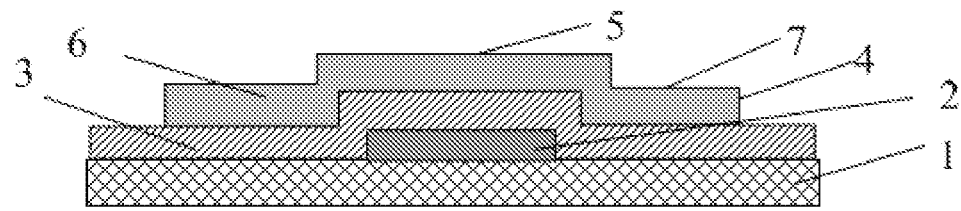

44) As shown in FIG. 29, the metal oxide semiconductor layer 4 is subjected to photolithography and etching so that an active region is formed. The active region comprises the source region 6, the drain region 7 and the channel region 5.

Figure 30:
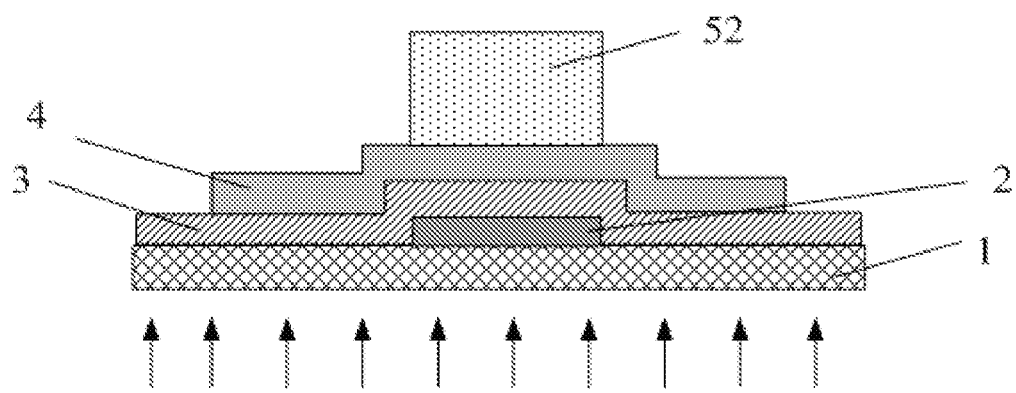

45) As shown in FIG. 30, the active region protection layer 41 after being subjected to photolithography and etching is coated by a layer of photoresist which is positive. Then, the photoresist is exposed from the back surface of the substrate by using the gate electrode 2 as a mask (in a direction indicated by an arrow in FIG. 21). Next, a developing process is performed. The portion of the layer of photoresist which is blocked by the gate electrode 2 is not exposed and thus cannot be dissolved in a developing solution, while the portion of the layer of photoresist which is not blocked by the gate electrode 2 is exposed and thus dissolved in the developing solution. Thus, a photoresist pattern 52 as shown is formed.

Figure 31:
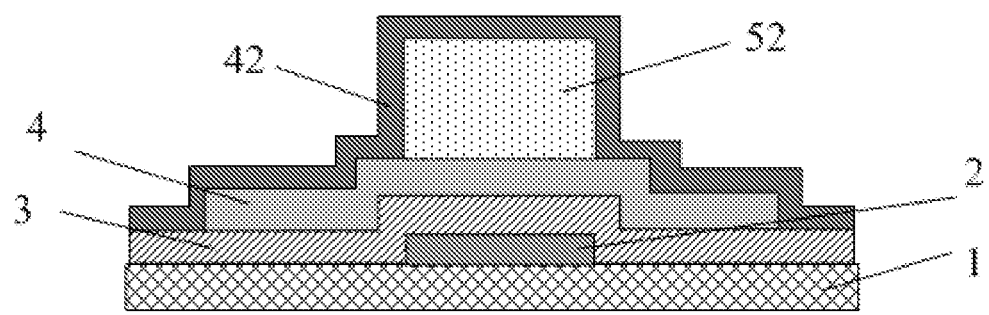

46) As shown in FIG. 31, a layer of metal film 42 is formed on the layer of photoresist 52 and the metal oxide semiconductor layer 4. The layer of metal film 42 may be formed from chromium, molybdenum, titanium, aluminium or the like by magnetron sputtering, and has a thickness of 20-100 nm.

Figure 32:
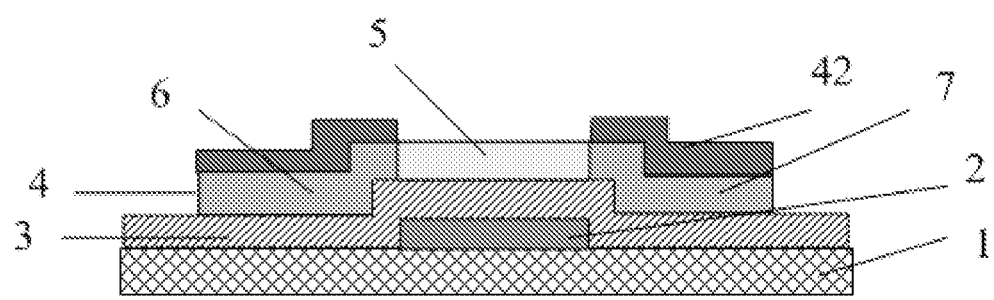

47) As shown in FIG. 32, the layer of photoresist 52 and the layer of metal film 42 on the surface of the layer of photoresist 52 have been removed by a lift-off process, so that the channel region 5 in the central portion of the metal oxide semiconductor layer 4 is exposed, and the rest is still protected by the layer of metal film 42. Then, the layer of metal film 42 is subjected to photolithography and etching processes, and thus a pattern of the layer of metal film is obtained. Next, the channel region is oxidized by a plasma having oxidbillity at a low temperature. In the present example, the channel region can be oxidized by an oxygen plasma for 5~60 minutes. Since the channel region 5 is exposed and thus oxidized by the oxygen plasma, the concentration of oxygen vacancies in the channel region 5 is reduced and the channel region 5 turns to have a low carrier concentration. In the present example, since the oxygen plasma is used, the oxidization may be conducted at low temperatures, such as 25-180° C. The upper temperature limit within which the oxidization can be conducted is the highest temperature that the substrate 1 can stand.

Figure 33:
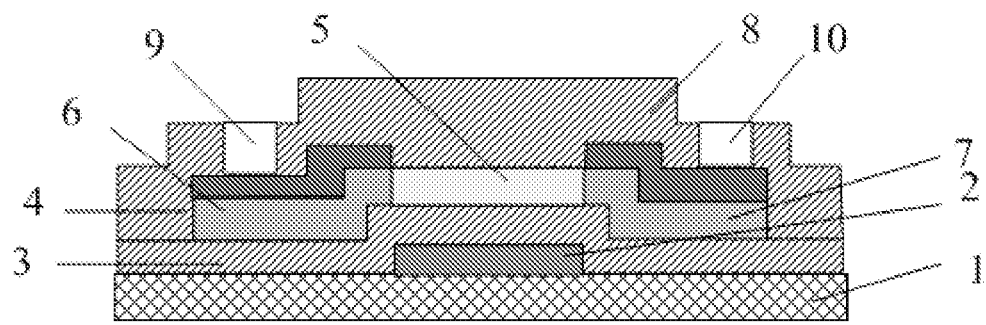

48) As shown in FIG. 33, a layer of silicon nitride 8 having a thickness of 100~300 nm is deposited by plasma enhanced chemical vapor deposition (PECVD) or magnetron sputtering. Then, the photolithography and etching processes are performed to form contact holes 9 and 10 of the electrode.

Figure 34:
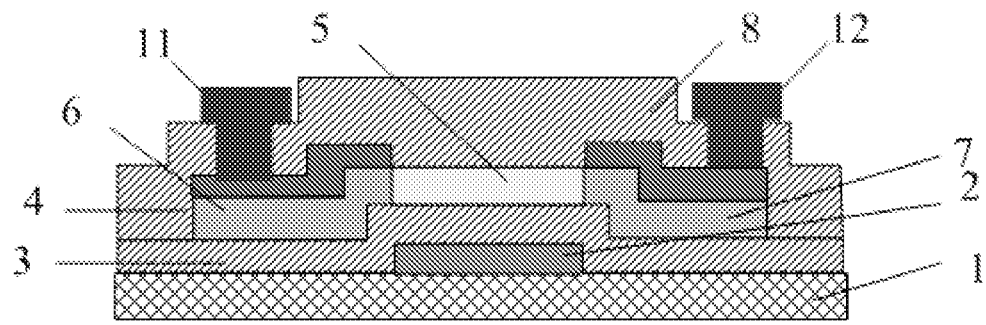

49) As shown in FIG. 34, a layer of aluminum film having a thickness of 100~300 nm is deposited by magnetron sputtering, and then subjected to photolithography and etching to form metal lead electrodes and interconnections 11 and 12 of the electrodes of the thin film transistor.

The method for manufacturing a thin film transistor according to the present invention has the following advantages.

1. In the method for manufacturing a thin film transistor according to the present invention, the self-aligns between the source and drain regions and the gate electrode, while the source and drain regions of the active layer of the transistor have high carrier concentrations, and the channel region has a low carrier concentration at a gate bias of zero. Thus, on the one hand, the manufacturing cost is reduced and the manufacturing process is simplified. On the other hand, the parasitic effect is reduced so that the qualification rate of thin film transistors is improved so as to reduce the manufacturing cost.

2. In the method for manufacturing a thin film transistor according to the present invention, the channel region is oxidized by the oxygen plasma. Since the oxygen free radicals in the plasma have a strong activity even at low temperatures, the oxidation process can be performed at low temperatures. Thus, the cheap substrate for low temperatures may be used so that the manufacturing cost is reduced.

It is noted that the present invention is not limited to the above embodiments. Without departing the concept of the present invention, simple deduction or substitution made by the skilled in the art should be within the scope of the present invention.

The invention claimed is:

1. A method for manufacturing a self-aligned thin film transistor, comprising
   a step of forming a gate electrode, wherein the metal gate electrode is formed on a substrate;
   a step of forming gate dielectric layer, wherein the gate dielectric layer covering the gate electrode is formed on the substrate;
   a step of forming and processing an active region, wherein a metal oxide semiconductor layer having a high carrier concentration is formed on the gate dielectric layer and processed to form the active region including a source region, a drain region and a channel region, a layer of photoresist is then coated on the metal oxide semiconductor layer, exposed from a back surface of the substrate by using the gate electrode as a mask and developed so that a photoresist pattern is formed, the photoresist pattern is processed so that the channel region on the metal oxide semiconductor layer is exposed and oxidized by a plasma having oxidbillity at a temperature which is lower than the highest temperature that the substrate can stand; and
   a step of leading electrodes, wherein electrode leads for the source region, drain region and gate electrode are formed.

2. The method according to claim 1, wherein the plasma having oxidbillity is oxygen plasma.

3. The method according to claim 1, wherein the metal gate electrode is opaque.

4. The method according to claim 1, wherein the step of forming and processing an active region further comprises performing a thermal treatment on the metal oxide semiconductor layer in an oxygen-free environment before the metal oxide semiconductor layer is processed to form the active region.

5. The method according to claim 1, wherein the channel region is oxidized by a plasma having oxidbillity at a temperature of 25-180° C.

6. The method according to claim 1, further comprises, prior to coating a layer of photoresist on the metal oxide semiconductor layer forming the active region, forming a dielectric protection layer on the metal oxide semiconductor layer, coating a layer of photoresist on the dielectric protection layer and processing the dielectric protection layer with the photoresist so as to expose the channel region on the metal oxide semiconductor layer.

7. The method according to claim 6, wherein the layer of photoresist is a negative one, and the following processes are performed after the layer of photoresist is formed: the layer of photoresist is exposed from the back surface of the substrate by using the gate electrode as a mask and developed so that a photoresist pattern is formed, and then the dielectric protection layer is removed by using the photoresist pattern as a mask so that the channel region on the metal oxide semiconductor layer is exposed.

8. The method according to claim 1, wherein the layer of photoresist is a negative one, and the following processes are performed after the layer of photoresist is formed: the layer of photoresist is exposed from the back surface of the substrate by using the gate electrode as a mask and developed so that a photoresist pattern is formed, and thus the channel region on the metal oxide semiconductor layer is exposed.

9. The method according to claim 1, wherein the layer of photoresist is a positive one, and the following processes are performed after the layer of photoresist is formed: the layer of photoresist is exposed from the back surface of the substrate by using the gate electrode as a mask and developed so that a photoresist pattern is formed, then a dielectric protection layer is formed on the photoresist pattern, the dielectric protection layer is processed so that the channel region on the metal oxide semiconductor layer is exposed.

10. The method according to claim 1, wherein the layer of photoresist is a positive one, and the following processes are performed after the layer of photoresist is formed: the layer of photoresist is exposed from the back surface of the substrate by using the gate electrode as a mask and developed so that a photoresist pattern is formed, then a layer of metal film is formed on the photoresist pattern, the layer of metal film is processed so that the channel region on the metal oxide semiconductor layer is exposed.

11. The method according to claim 1, wherein the gate dielectric layer is formed from a transparent material.

12. The method according to claim 1, wherein the substrate is a transparent substrate which is high temperature resistance or not high temperature resistance.

* * * * *